(12) United States Patent
Orlowski et al.

(10) Patent No.: US 6,964,911 B2
(45) Date of Patent: Nov. 15, 2005

(54) METHOD FOR FORMING A SEMICONDUCTOR DEVICE HAVING ISOLATION REGIONS

(75) Inventors: Marius K. Orlowski, Austin, TX (US); Alexander L. Barr, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/668,714

(22) Filed: Sep. 23, 2003

(65) Prior Publication Data

US 2005/0064669 A1    Mar. 24, 2005

(51) Int. Cl.$^7$ .............................................. H01L 21/76
(52) U.S. Cl. ...................... 438/400; 438/404; 438/411; 438/413; 438/421
(58) Field of Search ...................... 438/404, 411, 413, 438/421, FOR 222; 257/E21.564, E21.561

(56) References Cited

U.S. PATENT DOCUMENTS

| | | | | |
|---|---|---|---|---|
| 6,091,076 A | * | 7/2000 | Deleonibus | 257/24 |
| 6,352,903 B1 | * | 3/2002 | Rovedo et al. | 438/387 |
| 6,379,748 B1 | * | 4/2002 | Bhandari et al. | 427/255.394 |
| 2003/0040185 A1 | | 2/2003 | Jun | |

FOREIGN PATENT DOCUMENTS

FR    2 799 307    *    1/1999    ......... H01L 29/786

OTHER PUBLICATIONS

Monfray et al., First 80nm SON (Silicon-On-Nothing) MOSFETS with perfect morphology and high electrical performance, IEEE, pp. 29.7.1-29.7.4 (2001).*

Monfray et al., "50nm-Gate All Around (GAA)—Silicon On Nothing (SON)—Devices: A Simple Way to Co-Integration of GAA Transistors Within Bulk MOSFET Process," IEEE 2002 Symposium On VLSI Technology Digest of Technical Papers, pp. 108-109.

Borland, "Novel Device Structures by Selective Epitaxial Growth (SEG)," IEEE, 4 pgs. (1987).

Terada et al, "A New DRAM Cell with a Transistor on a Lateral Epitaxial Silicon Layer (TOLE Cell)," IEEE Transactions on Electron Devices, vol. 27, No. 9, Sep. 1990, pp. 2052-2057.

Terada et al., "A CMOS/Partial-SOI Structure for Future ULSIs," IEEE SOS/SOT Technology Workshop, p. 37 (1988).

Monfray et al., "SON (Silicon-On-Nothing) P-MOSFETs With Totally Silicided (CoSi$_2$) Polysilicon on 5nm-thick Si-films: The Simplest Way to Integration of Metal Gates on Thin FD Channels," IEEE, p. 263-266 (2002).

Monfray et al., "Highly-performant 38nm SON (Silicon-On-Nothing) P-MOSFETS With 9nm-thick Channels," 2002 IEEE International SOI Conference, pp. 20-22.

Monfray et al., "First 80nm SON (Silicon-On-Nothing) MOSFETS With Perfect Morphology and High Electrical Performance," IEEE, pp. 29.7.1-29.7.4 (2001).

(Continued)

Primary Examiner—George Fourson
Assistant Examiner—Julio J. Maldonado
(74) Attorney, Agent, or Firm—Kim-Marie Vo; Michael P. Noonan

(57) ABSTRACT

A method for forming a semiconductor device having isolation structures decreases leakage current. A channel isolation structure decreases leakage current through a channel structure. In addition, current electrode dielectric insulation structures are formed under current electrode regions to prevent leakage between the current electrodes.

24 Claims, 4 Drawing Sheets

OTHER PUBLICATIONS

Jurczak et al., "Silicon-on-Nothing (SON)—an Innovative Process for Advanced CMOS," IEEE Transactions on Electron Devices, vol. 47, No. 11, Nov. 2000, pp. 2179-2187.

Burghartz et al., "Partial-SOI Isolation Structure for Reduced Bipolar Transistor Parasitics," IEEE Electron Device Letters, vol. 13, No. 8, Aug. 1992, pp. 424-425.

Kubota et al., "A New Soft-Error Immune DRAM Cell With a Transistor On a Lateral Epitaxial Silicon Layer (TOLE Cell)," IEEE, 4 pgs. (1987).

Ogura, "Partial SOI/SON Formation by $He^+$ Implantation and Annealing," 2002 IEEE International SOI Conference, pp. 185-186.

* cited by examiner

US 6,964,911 B2

METHOD FOR FORMING A SEMICONDUCTOR DEVICE HAVING ISOLATION REGIONS

FIELD OF THE INVENTION

This invention relates generally to a method for forming semiconductor devices, and more specifically, to a method for forming isolation regions.

BACKGROUND

As semiconductor devices are scaled down. (i.e., decreased in size), the distance between a source and a drain of a transistor decreases. The decreased distance increases the possibility of a leakage path between the source and the drain. The leakage path allows charge to leak from the transistor even when the transistor is in the "off" state. The leaked charge can drain a power supply source for the transistor and, thus is especially problematic for low power applications. For at least these reasons, a need exists for a method to decrease the leakage current between the source and the drain of transistors.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
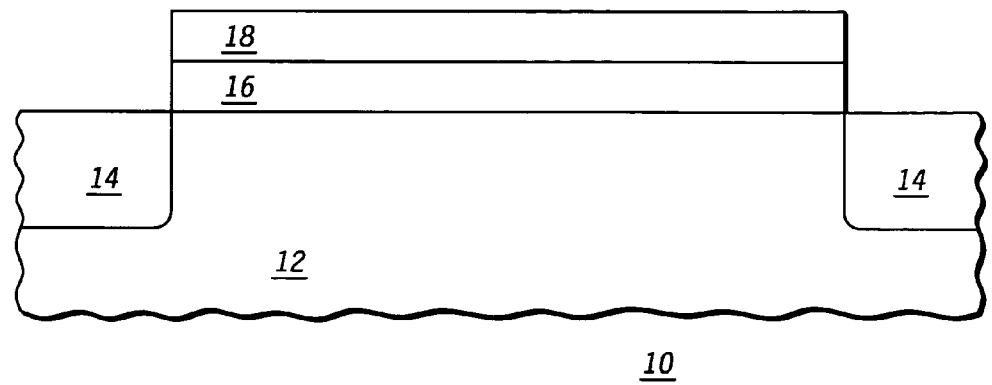
FIG. 1 illustrates in cross-section a portion of a semiconductor device having semiconductor layers formed over a semiconductor substrate in accordance with one embodiment of the present invention.

Illustrated in FIG. 1 is a cross-section of a semiconductor device 10 with isolation regions 14 formed within the semiconductor device 10 and a first semiconductor layer 16 and a second semiconductor layer 18 formed over the semiconductor device 10. In a preferred embodiment, the semiconductor device 10 is silicon, but the semiconductor device 10 may be silicon germanium, gallium arsenide, the like, and combinations of the above. The isolation regions 14 may be shallow trench isolation (STI) regions formed using conventional methods. In the embodiments shown in FIG. 1, the isolation regions 14 are coplanar with the top surface of the semiconductor substrate 12. In another embodiment, the isolation regions 14 are higher than the top surface of the semiconductor substrate 12.

After providing a semiconductor substrate 12 and forming the isolation regions 14, the first semiconductor layer 16 is formed, in one embodiment, by epitaxially growing a silicon germanium (SiGe) or silicon (Si) layer. Alternatively, an amorphous layer can be deposited and recrystallized via heating to form a crystalline structure for the first semiconductor layer 16. In another embodiment, a top portion of the semiconductor substrate 12 can be heavily implanted, for example, with germanium and then recystallized via heating to form the first semiconductor layer 16. As will become apparent below, it is desirable that the first semiconductor layer 16 is crystalline in order for overlying second semiconductor layer 18 to be a crystalline layer if formed by epitaxial growth.

The second semiconductor layer 18 is formed over the first semiconductor layer 16. In one embodiment, the second semiconductor layer 18 is epitaxially grown monocrystalline silicon (Si) that is grown from the first semiconductor layer 16, which in this embodiment is SiGe. As will become apparent below, the second semiconductor layer 18 will serve as a channel region for the semiconductor device and, thus it is desirable that the second semiconductor layer 18 has a crystalline structure to achieve the desired electrical properties in the channel region. The second semiconductor layer 18 can be any semiconductor material and is preferably crystalline.

Figure 2:
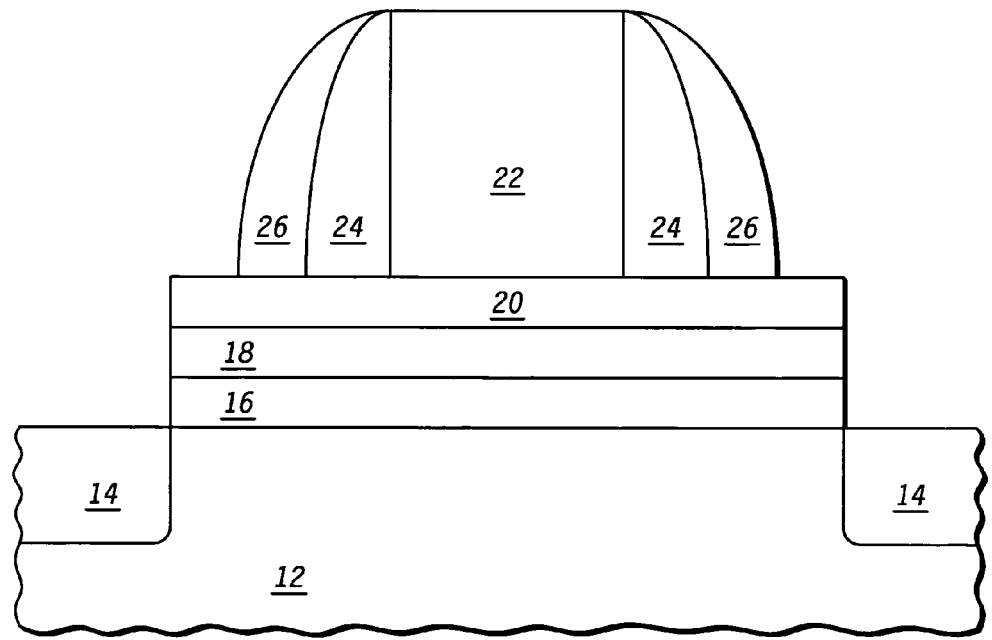
FIG. 2 illustrates the semiconductor device of FIG. 1 after forming a dielectric layer, a gate electrode and spacers in accordance with one embodiment of the present invention.

After forming the first semiconductor layer 16 and the second semiconductor layer 18, a first dielectric layer 20 is formed over the second semiconductor layer 18, as shown in FIG. 2. A portion of the first dielectric layer 20 will serve as the gate dielectric for the semiconductor device, as will be better understood after further processing is explained.

A conductive layer is formed over the first dielectric layer 20 and patterned to form a gate electrode 22 (a current electrode 22). The gate electrode 22 may be a polysilicon gate or a metal gate. Any suitable materials may be used.

After forming the gate electrode 22, a nitride layer, which is a dielectric layer, is deposited over the semiconductor device 10 and anisotropically etched to form nitride spacers 24, which serve to isolate the gate electrode 22 from other layers. In one embodiment, an (optional) oxide liner may be present between the nitride spacers 24 and the gate electrode 22.

Formed over the nitride spacers 24 is a second dielectric layer, which in one embodiment is silicon dioxide formed using tetraethyorthosilane (TEOS). Alternatively, any dielectric material may be used. The second dielectric layer is anisotropically etched to from dielectric spacers 26, which are optional. The patterned gate electrode 22, the nitride spacers 24, and the dielectric spacers 26 are illustrated in FIG. 2.

Figure 3:
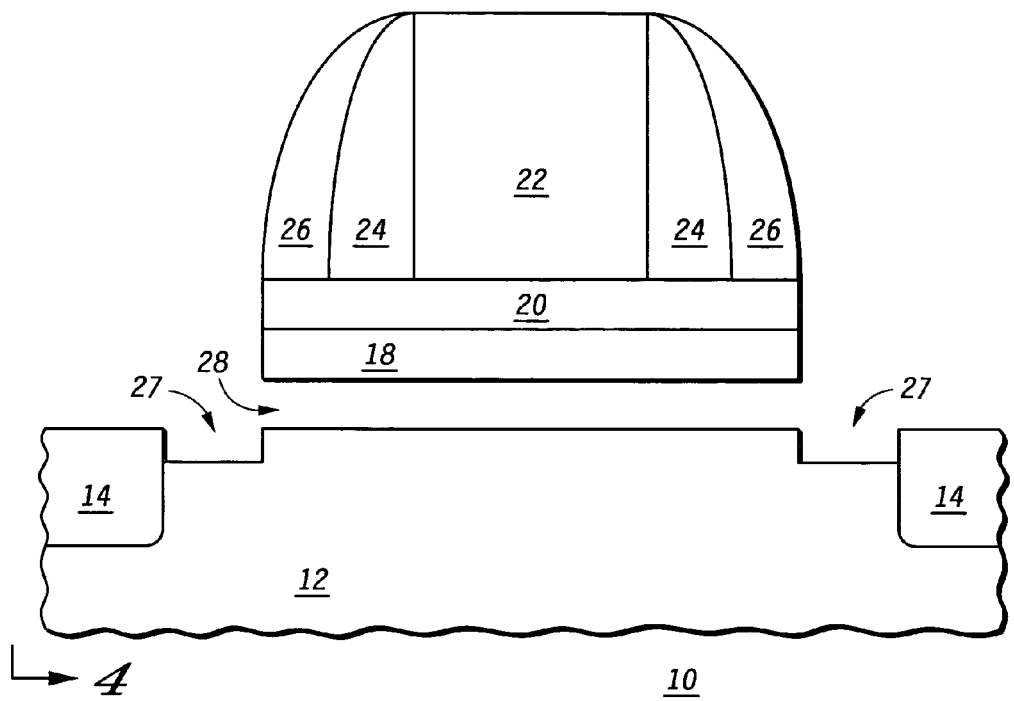
FIG. 3 illustrates the semiconductor device of FIG. 2 after removing an epitaxial layer in accordance with one embodiment of the present invention.

As shown in FIG. 3, after forming the spacers 24 and 26 the first dielectric layer 20, the second semiconductor layer 18 and the first semiconductor layer 16 are etched using the dielectric spacers 26 as a hardmask and the first semiconductor layer 16 is then removed. In one embodiment, a plasma etch is performed to etch the first dielectric layer 20, the second semiconductor layer 18, and the first semiconductor layer 16 using conventional chemistries. The plasma etch may etch into the semiconductor substrate 12 and form recesses 27 in the semiconductor substrate 12. The recesses 27 may be formed because the etch chemistries used to pattern the second semiconductor layer 18 and the first semiconductor layer 16 may not be sufficiently selective to the material used for the semiconductor substrate 12.

After etching the first dielectric layer 20, the second semiconductor layer 18, and the first semiconductor layer 16, portions of the first semiconductor layer 16 are removed using a wet or plasma etch to form a gap or void 28. The chemistry is selective to the second semiconductor layer 18, the semiconductor substrate 12 and the first dielectric layer 20 and the dielectric spacers 26. For example, dilute HF, nitric acid and water may be used to etch the first semiconductor layer 16 if the first semiconductor layer 16 is silicon germanium, the second semiconductor layer 18 and the semiconductor substrate 12 are silicon and the first dielectric layer 20 and the dielectric spacers 26 are silicon dioxide. In the embodiment shown in FIG. 3, substantially all of the first semiconductor layer 16 is removed. However, if the gate length is greater than or equal to approximately 0.6 microns, a portion of the first semiconductor layer 16 (remaining portion of the first semiconductor layer 16) may remain underneath the gate electrode 22. The remaining portion of the first semiconductor layer 16 will be approximately in the center of the gap 28 because the chemistry is unable to remove all of the first semiconductor layer 16. In other words, if the gate length is long enough, the gap 28 may be divided by a portion of the first semiconductor layer 16 that is not removed. However, in the embodiment illustrated in FIG. 3, the entire first semiconductor layer 16 is removed.

Figure 4:
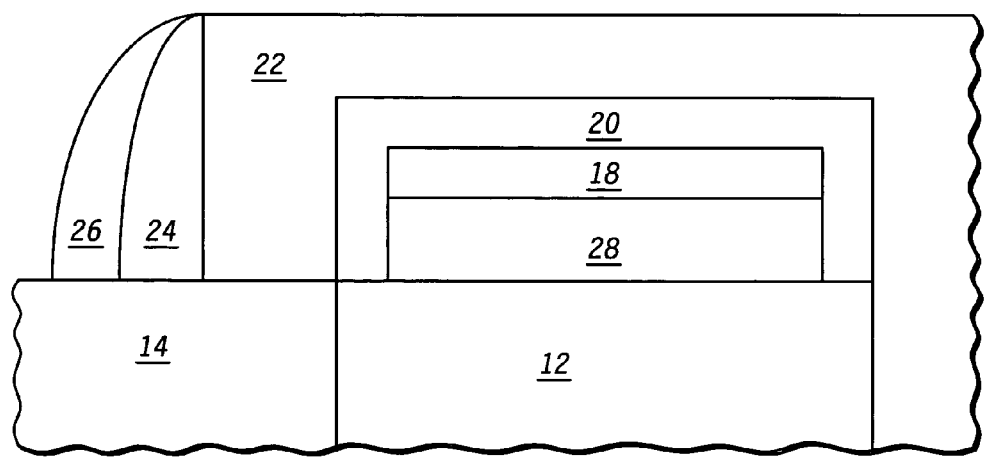
FIG. 4 illustrates another portion and view of the cross-sectional portion of the semiconductor device of FIG. 3 in accordance with one embodiment of the present invention.

When the first semiconductor layer 16 is removed to form the gap 28, the layers above the gap 28 are supported by the gate electrode 22 and the nitride spacers 24 and the dielectric spacers 26 in portions of the semiconductor device 10, which are not shown in FIG. 3 but are illustrated in FIG. 4. FIG. 4 is a cross-sectional view of FIG. 3 in the direction that is perpendicular to the page (i.e., in and out of the page). Thus, the structures in FIGS. 3 and 4 are perpendicular to each other.

As illustrated in FIG. 4, the first dielectric layer 20 wraps around the second semiconductor layer 18 and had wrapped around the first semiconductor layer 16. In other words, the first dielectric layer 20 isolates the second semiconductor layer 18 from the gate electrode 22. When the first semiconductor layer 16 is removed, the first dielectric layer 20 may wrap around the gap 28. Alternatively, the first dielectric layer 20 that wrapped around the first semiconductor layer 16 may be removed when forming the gap 28. The gate electrode 22 extends over the first dielectric layer 20 to the isolation regions 14. In addition, the nitride spacers 24 and the dielectric spacers 26, as shown in FIG. 4, may also terminate on the isolation regions 14.

Figure 5:
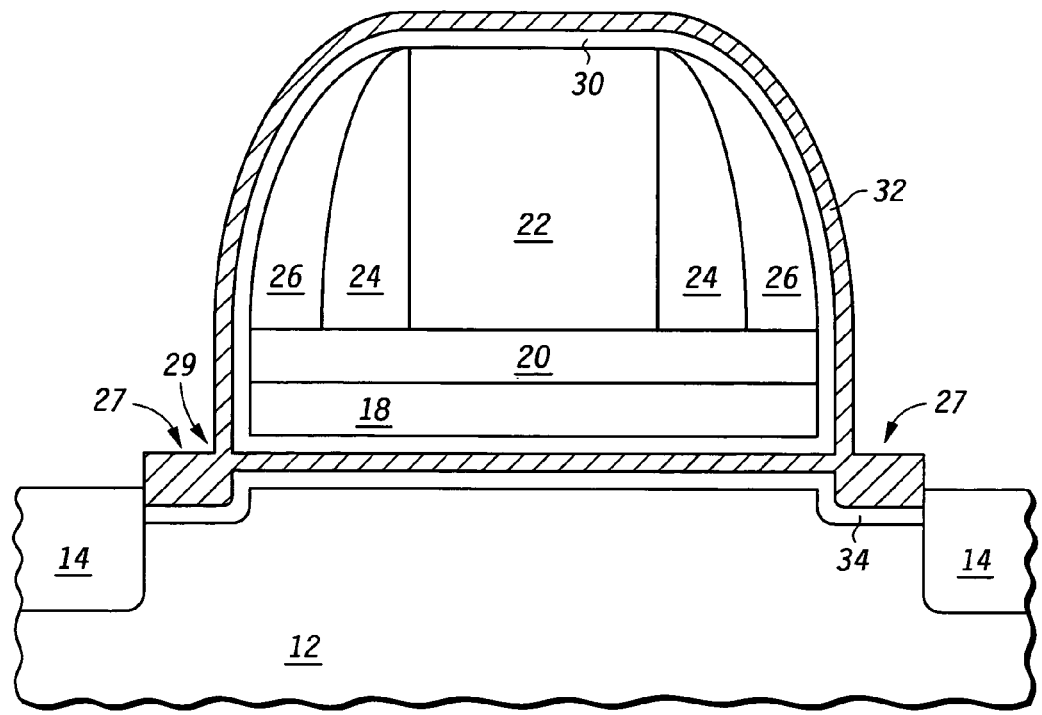
FIG. 5 illustrates the semiconductor device of FIG. 3 after forming insulating layers in accordance with one embodiment of the present invention.

FIG. 5 illustrates the semiconductor device 10 of FIG. 3 after filling the gap 28 to form a tunnel subjacent layer 29. After removing at least a portion of the first semiconductor layer 16, a second dielectric layer 30 and a third dielectric layer 34 are formed at least within the gap 28. The second dielectric layer 30 and the third dielectric layer 34 may be formed by rapid thermal oxidation (RTO) to create a high quality interface between the bottom surface of the second semiconductor layer 18 and the second dielectric layer 30 and the top of the semiconductor substrate 12 and the third dielectric layer 30. A high temperature oxide (HTO) may be deposited after the RTO in order to thicken the second dielectric layer 30 and the third dielectric layer 30 to the desired thickness. Since the semiconductor device 10 is not masked during the processes to form the second dielectric layer 30 and the third dielectric layer 34, any exposed surfaces will be oxidized. Thus, as shown in FIG. 5, the second dielectric layer 30 is in contact with a portion of the gate electrode 22, a portion of the dielectric spacers 26, a portion of the first dielectric layer 20 and a portion of the second semiconductor layer 18. In addition, the third dielectric layer 34 is in contact with the semiconductor substrate 12 including the recesses 27.

After forming the second dielectric layer 30 and the third dielectric layer 34, nitride layer 32 is chemically vapor deposited (CVD) or plasma vapor deposited (PVD). A nitride (e.g., $Si_3N_4$) is desirable because it prevents oxidation of the second semiconductor layer 18. Furthermore, the nitride should be selective to the first dielectric layer 20, the second dielectric layer 30, and the third dielectric layer 34 so that when the nitride is removed these layers are not affected. Thus, any other material besides a nitride that has these properties can be used. The nitride layer 32 is formed between the second dielectric layer 30 and the third dielectric layer 34 as well as over the portions of the second dielectric layer 30 that are outside the gap 28. The nitride layer 32, the second dielectric layer 30 and the third dielectric layer 34 form an isolation region (i.e., channel isolation structure or layer) for and under the second semiconductor layer 18 (i.e., channel structure 18).

Figure 6:
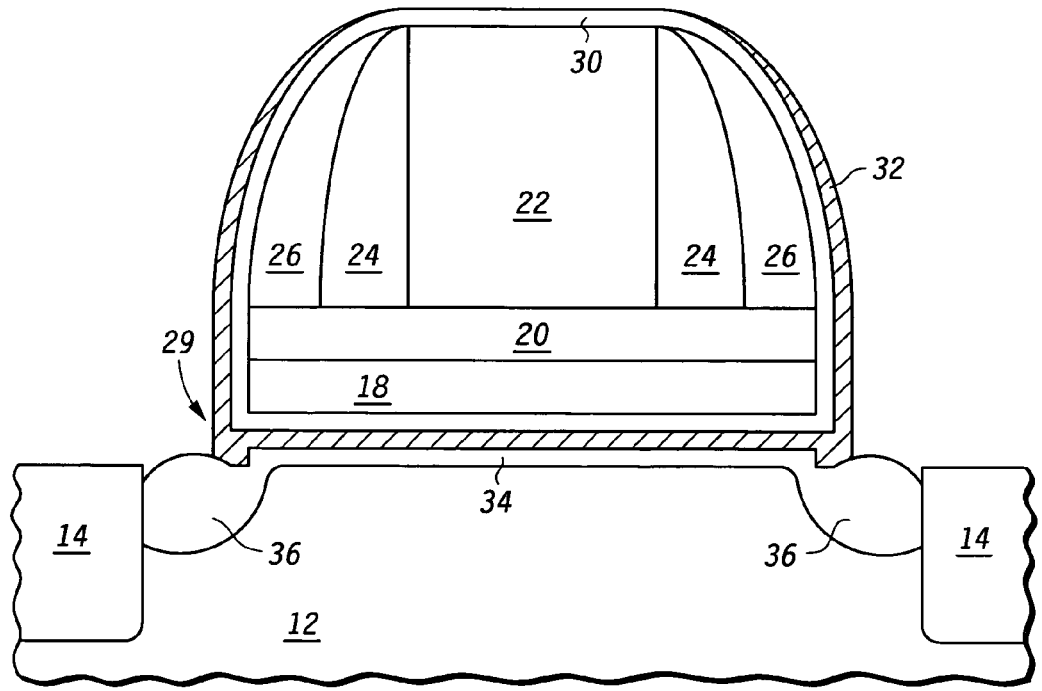
FIG. 6 illustrates the semiconductor device of FIG. 5 after forming current electrode dielectric isolation structure in accordance with one embodiment of the present invention.

As shown in FIG. 6, the nitride layer 32 is anisotropically etched to remove portions of the nitride layer 32 over the third dielectric layer 34 in the recesses 27 (i.e., feet of the nitride layer 32). In addition, portions of the nitride layer 32 that are horizontal, such as those over the gate electrode may also be removed. A fluorine-based chemistry, such as $CF_4$, may be used.

After removing portions of the nitride layer 32, the top or exposed surface of the semiconductor substrate 12 is oxidized to form current electrode dielectric isolation structures 36, as shown in FIG. 6. To form the current electrode dielectric isolation structures 36 the semiconductor substrate 12 may be oxidized or oxide may be formed over an oxide that has been previously created over the semiconductor substrate 12 during processing, such as a portion of the third dielectric layer 34. Thus, if present, the recesses 27 may be oxidized. A dry oxidation, wet oxidation, or combinations of the two may be performed to form the current electrode dielectric isolation structures 36.

In one embodiment, the current electrode dielectric isolation structures 36 are approximately 500 to 1000 Angstroms (50–100 nanometers), or preferably approximately 50 to 500 Angstroms (5–50 nanometers) or more preferably approximately 100–300 Angstroms (10–30 nanometers) in thickness. Regardless, the current electrode dielectric isolation structures 36 should not fully cover the sidewalls of the second semiconductor layer 18 when the source and drains are being formed because the second semiconductor layer 18 will be subsequently used to epitaxial grow current electrodes.

In one embodiment, the current electrode dielectric isolation structures 36 may also be nitrided and thus may be regions of oxynitride. If the semiconductor substrate 12 is silicon, the current electrode dielectric isolation structures 36 may be silicon dioxide or if nitrided, silicon oxynitride. The temperature for the oxidation is preferably between 700 to 1100 degrees Celsius. In the embodiment shown in FIG. 6, the current electrode dielectric isolation structures 36 will be formed within the semiconductor substrate 12 and will be in contact with the isolation region 14 and the third dielectric layer 34. To prevent the top of the gate electrode 22 from oxidizing during the formation of the current electrode dielectric isolation structures 36 an anti-reflective coating (ARC) may be present. The ARC may have been formed when etching the gate electrode 22 and may not have been removed until after the formation of the current electrode dielectric isolation structures 36.

Figure 7:
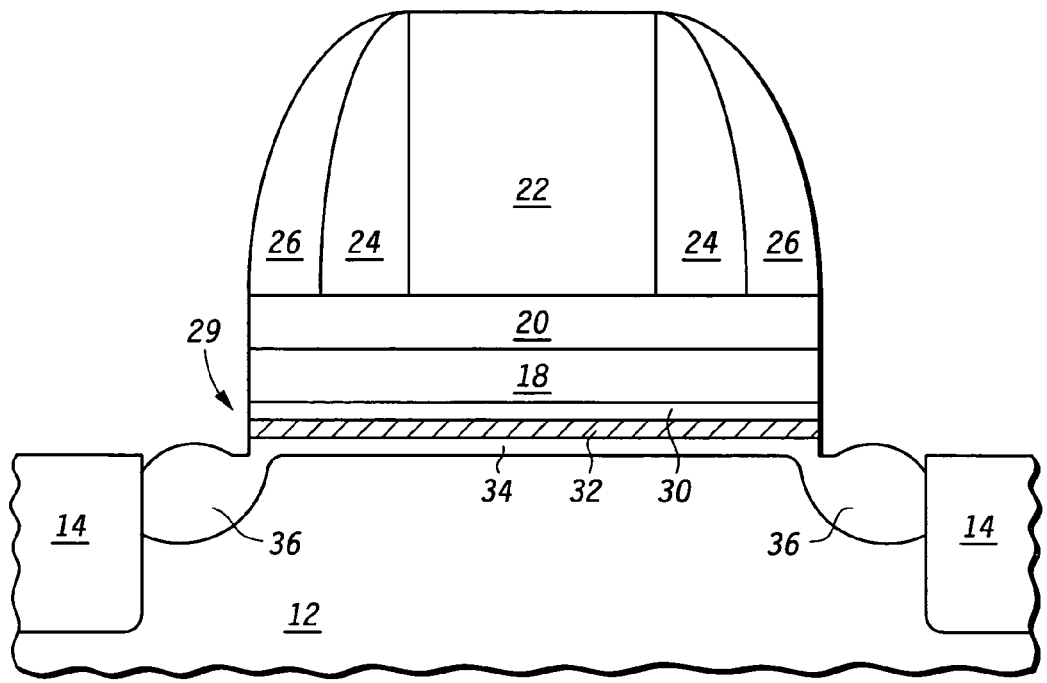
FIG. 7 illustrates the semiconductor device of FIG. 6 after removing portions of current electrode dielectric isolation structures in accordance with one embodiment of the present invention.

After forming the current electrode dielectric isolation structures 36, portions of the nitride layer 32 that remain outside the tunnel subjacent layer 29 are removed using an etch process that, in one embodiment, is selective to the material used for the second dielectric layer 30. (A skilled artisan should recognize that portions of the nitride layer 32 that are at the ends of the tunnel subjacent layer 29 may also be removed.) Furthermore, it is desirable that the chemistry used to remove portions of the nitride layer 32 is selective to the current electrode dielectric isolation structures 36. Next, portions of the second dielectric layer 30 outside the gap 28 are removed via etching. (A skilled artisan should recognize that portions of the nitride layer 32 that are at the ends of the tunnel subjacent layer 29 may also be removed.) Since the second dielectric layer 30 and the current electrode dielectric isolation structures 36 are both dielectric materials and may even be the same materials, it is likely that some of the current electrode dielectric isolation structures 36 will be removed while etching the second dielectric layer 30. However, the second dielectric layer 30 is thin relative to the current electrode dielectric isolation structures 36 so the amount of removal of the current electrode dielectric isolation structures 36 is either trivial or can be accounted for when determining the thickness of the current electrode dielectric isolation structures 36. The resulting structures after removal of portions of the nitride layer 32 and the second dielectric layer 30 that are outside the tunnel subjacent layer 29 are shown in FIG. 7.

Figure 8:
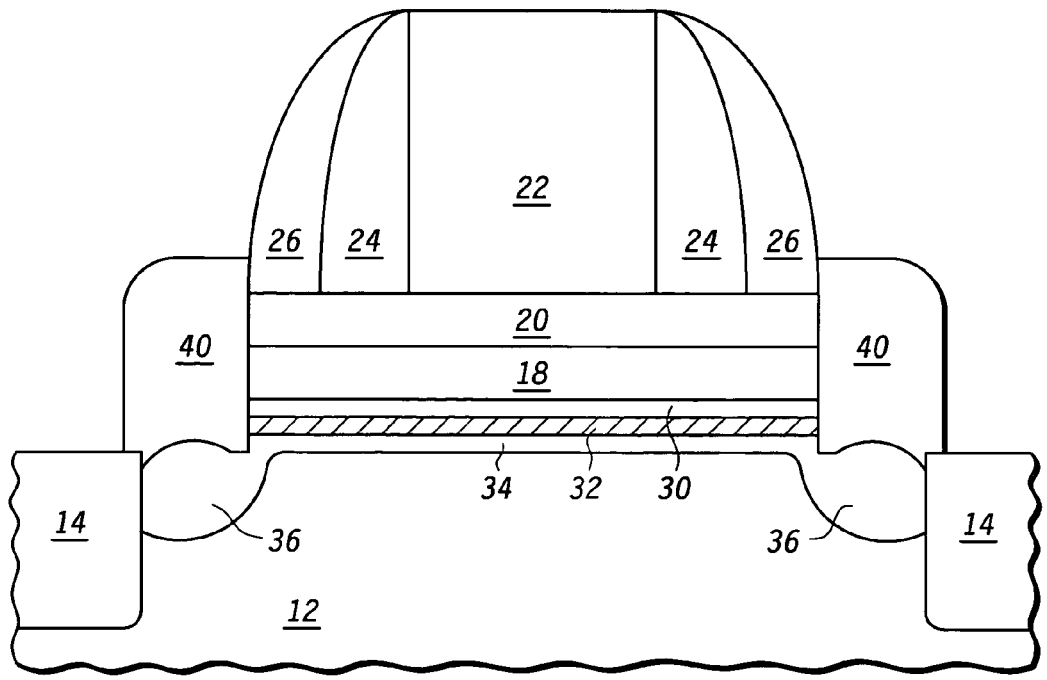
FIG. 8 illustrates the semiconductor device of FIG. 7 after forming current electrode regions.

As shown in FIG. 8, after removing portions of the second dielectric layer 30 and the nitride layer 32 that are outside the tunnel subjacent layer 29, current electrode regions/structures 40 are formed by selective epitaxially growth from the second semiconductor layer 18. In other words, only the current electrode regions 40 are grown. Thus, if the second semiconductor layer 18 is silicon, the current electrode regions 40 may be silicon (Si), SiGe or SiGeC. The current electrodes regions 40 may be doped after the semiconductor material is grown epitaxially or may be doped during epitaxial growth. Each of the current electrode regions 40 is either a source or drain (region).

By now it should be appreciated that there has been provided a method for forming a semiconductor device having three isolation regions: 1) the second dielectric layer 30, the nitride layer 32, and the third dielectric layer 34 in the gap 28; 2) the current electrode (semiconductor) structure 40; and 3) the current electrode dielectric isolation structure 36. In one embodiment, the semiconductor device is an isolated transistor. The current electrode dielectric isolation structures 36 prevent or minimize the leakage path between the current electrodes 40 through the semiconductor substrate 12. The second dielectric layer 30, the nitride layer 32, and the third dielectric layer 34 in the gap 28 prevent or minimize current leakage within the channel.

The presence of the three isolation regions makes the semiconductor substrate behave like a silicon-on-insulator (SOI) substrate. Hence, the semiconductor device 10 is a pseudo-SOI. In addition, having the three isolation regions for a semiconductor device instead of the buried oxide (BOX) layer allows for a thinner oxide or dielectric layer. Furthermore, an SOI wafer is more expensive than purchasing a semiconductor device having three isolation regions formed in a semiconductor layer for a semiconductor device.

In addition, the process of forming the current electrode dielectric isolation structures 36 can be tailored to specific semiconductor devices or transistors, thus the process is selective. In other words, only some or one semiconductor device on a semiconductor wafer may have the current electrode dielectric isolation structures 36, while others do not have the current electrode dielectric isolation structures 36. In addition, some or one semiconductor device on a semiconductor wafer may have the channel isolation (structure).

Furthermore, benefits may occur due to the current electrode dielectric isolation structures 36 stressing the channel isolation (structure). When oxide is formed it expands in volume and thus the current electrode dielectric isolation structures 36 may be exerting a compressive stress on the channel isolation (structure), which may improve hole and electron mobility and other electrical characteristics.

The transistor terms used herein may refer to one or both of a post-production, functional structure (e.g., a channel of a functional transistor) or a pre-fabrication precursor to such a structure (e.g., a structure which, upon completion of fabrication, will become a channel of a functional transistor). For example, during fabrication, the term "channel structure" refers to a channel precursor. Layer 18 in FIG. 2 is an example of one such channel structure which becomes a channel in FIG. 8 upon being coupled to current electrode structures (e.g., source and drain electrodes 40) for operation with a control structure (e.g., under control of control/gate electrode 22 of FIG. 8).

In the foregoing specification, the invention has been described with reference to specific embodiments. However, one of ordinary skill in the art appreciates that various modifications and changes can be made without departing from the scope of the present invention as set forth in the claims below. For example, the current electrode dielectric isolation structures 36 can be formed at a different point in the process provided a nitride layer can be used to protect the first dielectric layer 20 and the channel isolation structure, as it does in the embodiment described. Accordingly, the specification and figures are to be regarded in an illustrative rather than a restrictive sense, and all such modifications are intended to be included within the scope of the present invention.

Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of fabricating an isolated transistor comprising:
   providing a semiconductor substrate having a device structure thereon, the device structure comprising a channel structure and a control electrode structure overlying the channel structure, the channel structure being suspended over the semiconductor substrate and underlying the control electrode structure;
   depositing a channel isolation layer between the channel structure and the semiconductor substrate;
   forming a current electrode dielectric isolation structure laterally disposed to the channel structure; and
   depositing a current electrode structure over the current electrode dielectric isolation structure.

2. The method of claim 1 wherein the providing the semiconductor substrate and device structure comprises:
   providing the semiconductor substrate;
   forming a first layer of a first composition;
   forming a second layer of a second composition over the first layer, the second layer for providing the channel structure;
   forming a dielectric layer over the second layer; and
   forming at least a portion of the control electrode structure over the dielectric layer.

3. The method of claim 2 wherein the providing the semiconductor substrate and device structure further comprises:
   etching the dielectric layer and the first and second layers over a plurality of current electrode regions disposed laterally from the control electrode structure; and
   etching the first layer to substantially remove the first layer from under the second layer to provide a void underlying a channel region of the device structure.

4. The method of claim 2 wherein:
   forming the first layer of the first composition comprises forming silicon germanium;
   forming the second layer of the second composition comprises forming silicon; and
   forming the dielectric layer comprises forming silicon dioxide.

5. The method of claim 1 wherein the depositing the channel isolation layer comprises using at least one technique from the group consisting of chemical vapor deposition and plasma vapor deposition.

6. The method of claim 1 wherein the channel isolation layer comprises three sublayers, and the depositing the channel isolation layer comprises:
   forming a first dielectric layer substantially around the device structure, and a second dielectric layer over the semiconductor substrate and under the channel structure, the first and second dielectric layers having a first etch characteristic; and
   forming a third dielectric layer substantially around the first dielectric layer and over the second dielectric layer under the channel structure, the third dielectric layer having a second etch characteristic.

7. The method of claim 6 further comprising: removing at least a portion of the third dielectric layer to expose a top surface of the semiconductor substrate.

8. The method of claim 7 wherein the removing comprises anisotropically etching the third dielectric layer to selectively and substantially remove the third dielectric layer from over the device structure.

9. The method of claim 7 further comprising: forming a recess in the semiconductor substrate.

10. The method of claim 6 wherein:
    forming the first and second dielectric layers comprises forming an oxide; and
    forming the third dielectric layer comprise forming a nitride.

11. The method of claim 1 wherein the forming the current electrode dielectric isolation structure comprises:
    subjecting the semiconductor substrate to an oxygen containing environment; and
    oxidizing a top surface of the semiconductor substrate at least at the current electrode structure to grow an oxide isolation structure over the semiconductor substrate, the current electrode dielectric isolation structure comprising the oxide isolation structure.

12. The method of claim 11 wherein the semiconductor substrate is subjected to the oxygen containing environment through at least a portion of a dielectric layer disposed over the semiconductor substrate.

13. The method of claim 1 wherein the current electrode dielectric isolation structure is formed within the semiconductor substrate.

14. The method of claim 1 wherein the depositing current electrode structures over the current electrode structures comprises growing the current electrode structures using selective epitaxy.

15. A method of fabricating a semiconductor device, the method comprising:
    forming a first dielectric isolation structure within a semiconductor substrate;
    forming a second dielectric isolation structure within the semiconductor substrate;
    forming a third dielectric isolation structure abutting the first and second dielectric isolation structures and between the semiconductor substrate and a crystalline structure suspended over the semiconductor substrate by a supporting structure coupled to the semiconductor substrate;
    depositing a first current electrode structure over the first dielectric isolation structure; and
    depositing a second current electrode structure over the second dielectric isolation structure.

16. The method of claim 15 wherein: forming the first semiconductor process and forming the second dielectric isolation structure are performed simultaneously.

17. The method of claim 15 wherein the forming the third dielectric isolation structure is performed at a different time than the forming the first dielectric isolation structure and the forming the second dielectric isolation structure.

18. The method of claim 15 wherein the forming the first dielectric isolation structure and forming the second dielectric isolation structure are performed at substantially the same time.

19. The method of claim 18 wherein the depositing the first current electrode structure and depositing the second current electrode structure are performed at substantially the same time.

20. The method of claim 15 wherein the depositing the first current electrode structure and depositing the second current electrode structure are performed at substantially the same time.

21. A method of fabricating an isolated transistor comprising:
   providing a substrate;
   forming a channel isolation structure underlying a channel structure;
   forming a current electrode isolation structure in the substrate at each one of first and second current electrode regions disposed laterally to the channel structure, the channel isolation structure and the current electrode isolation structures being formed to adjoin; and
   epitaxially growing from the channel structure a current electrode over each of the current electrode isolation structures.

22. The method of claim 21 wherein the forming the current electrode isolation structures comprises oxidizing at least a portion of the substrate.

23. The method of claim 21 wherein the channel isolation structure comprises a plurality of dielectric layers, the forming the channel isolation structure comprising:
   forming a first dielectric layer under the channel structure;
   forming a second dielectric layer on the semiconductor substrate; and
   forming a third dielectric layer between the first and second dielectric layers.

24. The method of claim 23 wherein the forming the first dielectric layer and forming the second dielectric layer on the substrate are performed at substantially the same time.

* * * * *